(12) United States Patent
Lee et al.

(10) Patent No.: US 6,210,489 B1
(45) Date of Patent: *Apr. 3, 2001

(54) METHODS AND ETCHANTS FOR ETCHING OXIDES OF SILICON WITH LOW SELECTIVITY

(75) Inventors: Whonchee Lee, Boise; Richard C. Hawthorne, Nampa; Li Li, Meridian; Pai Hung Pan, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/448,020

(22) Filed: Nov. 23, 1999

Related U.S. Application Data

(62) Division of application No. 09/020,557, filed on Feb. 9, 1998, now abandoned, which is a continuation of application No. 08/611,275, filed on Mar. 5, 1996, now Pat. No. 5,716,535.

(51) Int. Cl.$^7$ .................................................. B08B 3/08
(52) U.S. Cl. ........................... 134/2; 136/3; 136/26; 136/28
(58) Field of Search ............................... 134/2, 3, 26, 28; 252/79.1, 79.2, 79.3; 216/99, 109; 438/756

(56) References Cited

U.S. PATENT DOCUMENTS

| | | | |
|---|---|---|---|
| 5,312,781 | 5/1994 | Gregor et al. | 437/235 |
| 5,438,013 | 8/1995 | Kim et al. | 437/60 |
| 5,476,816 | 12/1995 | Mautz et al. | 437/195 |
| 5,478,436 | 12/1995 | Winebarger et al. | 156/636.1 |
| 5,509,970 | 4/1996 | Shiramizu | 134/3 |
| 5,560,857 | 10/1996 | Sakon et al. | 510/175 |
| 5,563,100 | 10/1996 | Matsubara | 437/200 |
| 5,571,375 | 11/1996 | Izumi et at. | 156/646.1 |
| 5,716,535 | * 2/1998 | Lee et al. | 216/99 |
| 5,972,123 | 10/1999 | Verhaverbeke | 134/3 |

FOREIGN PATENT DOCUMENTS 2-284423   11/1990   (JP) .

OTHER PUBLICATIONS

"Super Q Etch—Certified Particle Grade Speciality Etch," Olin Electronic Materials, Olin Corporation, Process Chemicals, 2873 N. Nevada Street, Chandler, AZ 85225.

\* cited by examiner

Primary Examiner—Alexander Markoff
(74) Attorney, Agent, or Firm—Workman, Nydegger & Seeley

(57) ABSTRACT

A surface having exposed doped silicon dioxide such as BPSG is cleaned with a solution that etches thermal oxide at least one-third as fast as it etches the exposed doped silicon dioxide, resulting in more thorough cleaning with less removal of the exposed doped silicon dioxide. Specific applications to formation of container capacitors are disclosed. Preferred cleaning solutions include about 46 parts ammonium fluoride, about 9.5 parts hydrogen fluoride, and about 8.5 parts ammonium hydroxide in about 100 parts water by weight; and about 670 parts ammonium fluoride and about 3 parts hydrogen fluoride in about 1000 parts water by weight. The latter solution is also useful in cleaning methods in which a refractory metal silicide is exposed to the cleaning solution such as in cleaning prior to spacer formation or prior to a gate stack contact fill, in which case about 670 parts ammonium fluoride and about 1.6 parts hydrogen fluoride in about 1000 parts water is most preferred.

21 Claims, 3 Drawing Sheets

METHODS AND ETCHANTS FOR ETCHING OXIDES OF SILICON WITH LOW SELECTIVITY

1. RELATED APPLICATIONS

This is a divisional of U.S. patent application Ser. No. 09/020,557, filed on Feb. 9, 1998, titled "Methods and Etchants for Etching Oxides of Silicon with Low Selectivity", now abandoned which is a continuation of U.S. patent application Ser. No. 08/611,275, filed on Mar. 5, 1996, now U.S. Pat. No. 5,716,535, each of which are incorporated herein by reference.

BACKGROUND OF THE INVENTION

2. The Field of the Invention

The present invention relates to the manufacture of semiconductor devices. More particularly, the present invention is directed to methods employing etchants for etching oxides of silicon during the manufacture of a semiconductor device such that the selectivity of the etchant is low. The methods of the present invention are also useful in removing contamination other than silicon oxides typically encountered in semiconductor manufacturing process flows, such as polymer residues, while providing low selectivity.

3. The Relevant Technology

In the continuing quest for ever denser DRAM devices, the problem of forming for each memory cell capacitors having both sufficiently large capacitance to preserve a charge between refresh cycles and sufficiently small size to allow further reductions in circuit dimensions has become increasingly acute. Dimensional tolerances in capacitor formation have thus tended to become a yield-limiting and density-limiting factor in DRAM devices.

Clean processes are a significant source of decreased dimensional control in the formation of capacitor structures. Removal of native oxides and other types of oxide contamination is required at various steps during capacitor formation. A short dip in a dilute solution of hydrofluoric acid (HF), such as a 100:1 volumetric ratio of water to 49% HF solution, is typically employed for this purpose. Problems arise because the dilute HF solution also significantly and even preferentially attacks doped silicon dioxide such as BPSG in which the capacitor structures are formed and defined, resulting in decreased control of critical dimensions associated with the capacitor. A less selective process is thus needed to remove native oxides and other types of oxide contamination during capacitor formation without excessively attacking doped silicon dioxide such as BPSG.

A dilute HF solution is also typically employed to remove native oxide or other oxide contamination at process steps during which a refractory metal silicide such as titanium silicide is exposed to the solution. This may occur, for example, in a clean step prior to the formation of spacers around a gate stack that includes a refractory metal silicide layer, or during a clean step prior to filling a contact to a gate stack that includes a refractory metal silicide. As dimensions of gate stacks decrease, this use of dilute HF solution creates problems because the refractory metal silicide layer is preferentially etched by the dilute HF solution, such that where dimensional tolerances are small, the refractory metal silicide layer may be seriously damaged or even completely destroyed. A less selective process is thus needed to remove native oxide and other types of oxide contamination during gate formation and contact formation without excessively attacking refractory metal silicides.

SUMMARY AND OBJECTS OF THE INVENTION

An object of the present invention is to provide a method for removing native oxides and other types of oxide contamination during capacitor formation without excessively attacking doped silicon dioxide such as BPSG.

Another object of the present invention is to provide a method for removing native oxides and other types of oxide contamination without excessively attacking refractory metal silicides such as titanium silicide.

Still another object of the present invention is to provide a method for cleaning a surface having exposed doped silicon dioxide such as BPSG without removing significant amounts of the exposed doped silicon dioxide.

Still another object of the present invention is to provide a method for cleaning a surface having an exposed refractory metal silicide such as titanium silicide without removing significant amounts of the exposed refractory metal silicide.

In accordance with one general embodiment of the present invention, a surface having exposed doped silicon dioxide is cleaned with a buffered HF and ammonium hydroxide solution, resulting in removal of oxide contamination or polymer residues with decreased erosion of the doped silicon dioxide.

In accordance with another general embodiment of the present invention, a surface having an exposed refractory metal silicide is cleaned with a highly buffered HF solution, resulting in removal of oxide contamination with decreased erosion of the refractory metal silicide. This general embodiment is particularly useful in cleaning gate stacks prior to spacer formation and in cleaning contacts including contacts to gate stacks prior to contact fill.

In accordance with a method of the present invention, a capacitor contact formed through a layer of doped silicon dioxide to an active area of a semiconductor substrate is cleaned by either a highly buffered HF solution or by a buffered HF and ammonium hydroxide solution prior to the deposition of polysilicon to form the container of a container capacitor. The use of either of the above etchants to perform the capacitor contact clean decreases the amount of doped silicon dioxide removed by the capacitor contact clean, thereby reducing the likelihood of shorts between adjacent capacitors.

In accordance with another method of the present invention, a post-chemical mechanical polishing clean is performed to remove silica particles and other contamination remaining after isolation by chemical mechanical polishing (CMP) of polysilicon containers in doped silicon dioxide. Either a highly buffered HF solution or by a buffered HF and ammonium hydroxide solution is employed, resulting in less erosion of the doped silicon dioxide, providing better process control and less likelihood of subsequent formation of stringers.

In accordance with yet another method of the present invention, a contact to an active area of a semiconductor substrate formed through a layer of doped silicon dioxide containing container capacitors is cleaned, prior to filling the contact, with either a highly buffered HF solution or by a buffered HF and ammonium hydroxide solution. Use of the above cleaning solutions reduces the removal of doped silicon dioxide during the clean, decreasing the likelihood of a short from the contact to a container capacitor.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects the invention are obtained may be more fully explained, a more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention provides etchants having improved characteristics over typical dilute HF for various cleans used in the manufacture of semiconductor devices. Dilute HF has been widely used in the manufacture of semiconductor devices for many types of cleans requiring the removal of various oxides. These cleans include cleans for oxides such as thermal oxide and oxide contamination. Such oxide contamination includes native oxide and oxide residues from processes such as plasma etching. Improved etchant processes are needed, however, especially for the formation of structures having very small critical dimensions, such as the structures shown in FIGS. 1–3.

Figure 1:
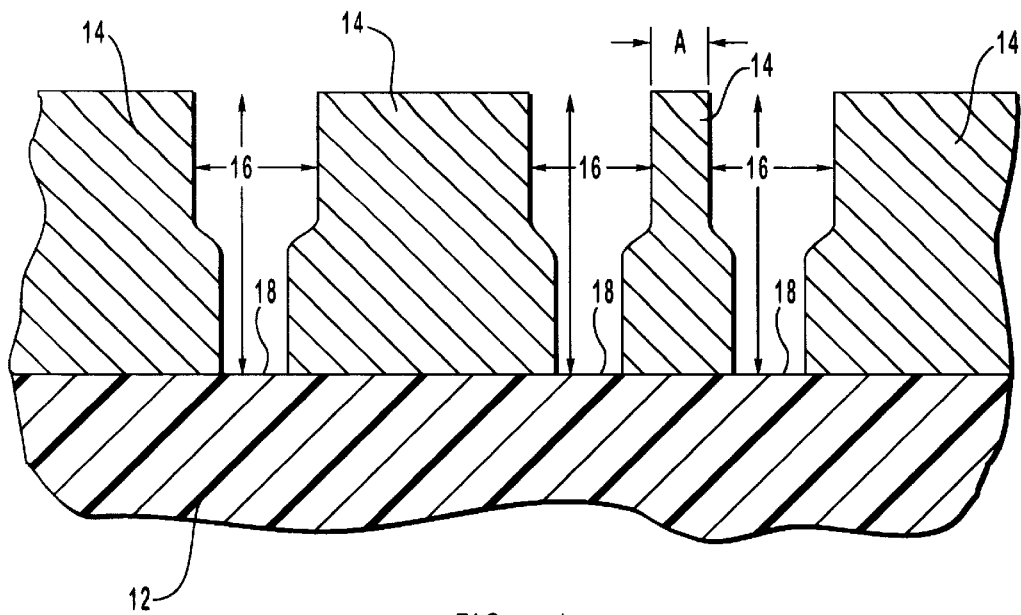
FIG. 1 is a partial cross section of a partially formed semiconductor device having spaces for container capacitors formed in a layer of BPSG.

FIG. 1 shows a cross section of a substrate 12, such as a silicon substrate situated on a semiconductor wafer, having formed thereon a layer of doped silicon dioxide 14 such as BPSG. Layer of doped silicon dioxide 14 has spaces 16 for container capacitors formed therethrough down to source/drain regions 18 defined in substrate 12.

Prior to deposition of a conductive layer over layer of doped silicon dioxide 14 and substrate 12 to form the container of a container capacitor, a clean step is performed to remove any remaining thermal oxide and native oxide or other oxide contamination at source/drain regions 18. Because of the close tolerances employed in high-density memory circuits, the distance A between closely grouped pairs of spaces 16 is quite small. If the clean step erodes layer of doped silicon dioxide 14 sufficiently, distance A between closely adjacent spaces will be reduced too greatly, resulting in shorting of adjacent capacitors.

To avoid this problem, the present invention utilizes a clean step in which the rate of removal of unwanted oxide, such as thermal oxide or oxide contamination, is much increased relative to the rate of removal of layer of doped silicon dioxide 14, when compared with the typical dilute HF. For example, dilute HF (100:1) can remove layer of doped silicon dioxide 14 at least nine (9) times the rate of removal of thermal oxide, while the clean steps utilized in the present invention typically remove layer of doped silicon dioxide 14 less than or equal to three (3) times the rate of removal of thermal oxide. This allows sufficient cleaning for the subsequently deposited conductive layer to form a reliable contact to source/drain regions 18 without resulting in too great a decrease in distance A.

Figure 2:
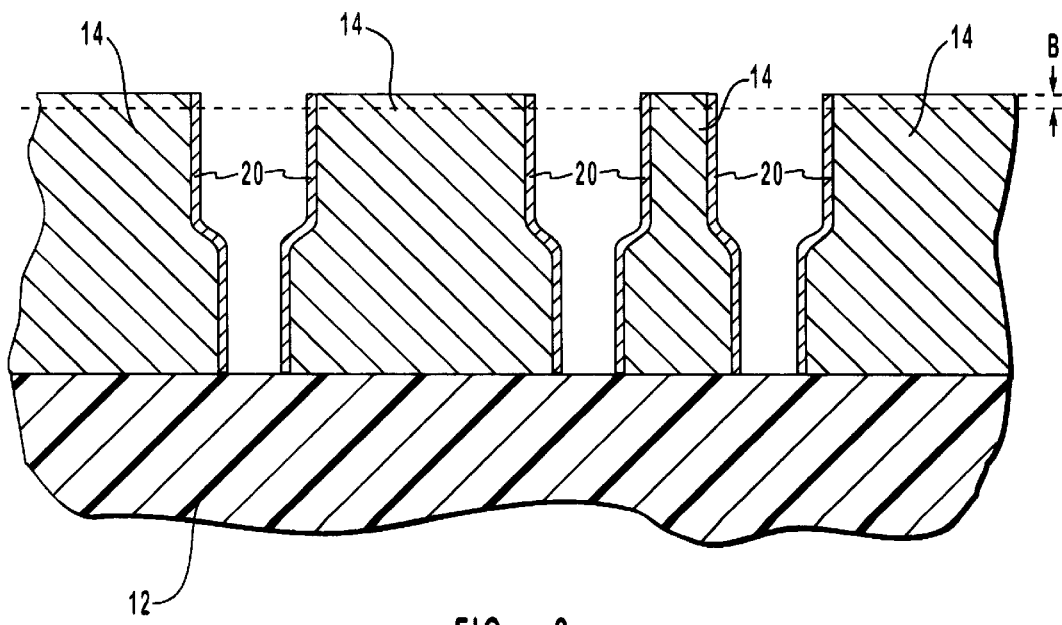
FIG. 2 is a cross section of the structure represented in FIG. 1 after deposition of a layer of a conducive material and chemical mechanical polishing.

FIG. 2 shows a cross section of the structure shown in FIG. I after further processing including deposition of a layer of conductive material such as polysilicon over layer of doped silicon dioxide 14 and substrate 12 and after removal of those portions of the layer of conductive material above the uppermost surface of layer of doped silicon dioxide 14. This results in containers 20 of the conductive material formed within spaces 16.

The removal of those portions of the layer of conductive material above the uppermost surface of layer of doped silicon dioxide 14 is typically accomplished by chemical mechanical polishing (CMP). After polishing by CMP, a clean step is required to remove silicon dioxide particles from the polishing slurry and other contamination. This clean step is typically a dilute HF dip. While the dilute HF dip does not significantly etch containers 20, layer of doped silicon dioxide 14 is etched to a depth illustrated in FIG. 2 as depth B from the uppermost surface of layer of silicon dioxide 14. Since containers 20 are not etched by the clean step, removal of layer of doped silicon dioxide 14 to depth B results in a stepped profile at containers 20. If depth B is sufficiently large, the resulting stepped profile at containers 20 can cause stringers and other problems in subsequent capacitor layers, resulting in shorts and circuit failures.

The present invention avoids this problem by employing a clean step after CMP in which the rate of removal of silicon dioxide particles and other contamination is much increased relative to the rate of removal of layer of doped silicon dioxide 14, when compared with the typical dilute HF. This results in a reduction of depth B such that stringers and other subsequent problems are less likely to occur. This clean step may also be beneficially employed at any other process point at which a surface polished by CMP has both silicon or polysilicon and silicon dioxide exposed.

Figure 3:
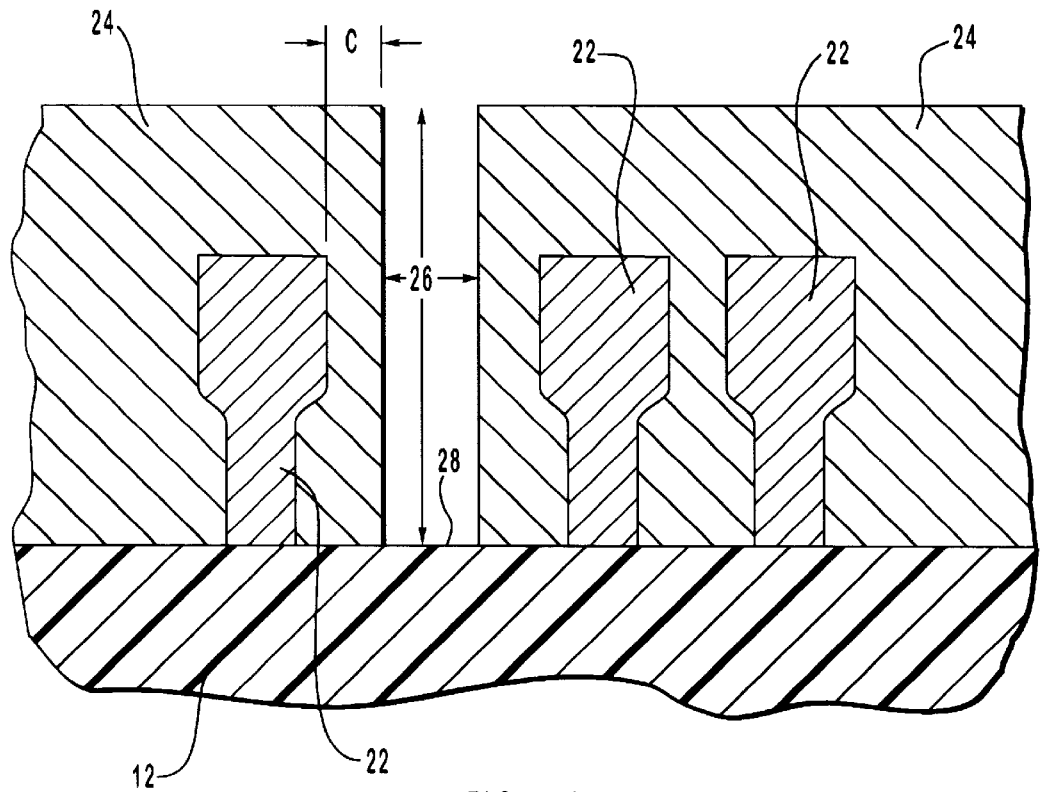
FIG. 3 is a cross section of the structure represented in FIG. 2 after further processing.

FIG. 3 is a cross section of the structure shown in FIG. 2 after further processing including completion of container capacitors 22 and at least one additional deposition of doped silicon dioxide, resulting in a layer 24 of doped silicon dioxide comprised of multiple layers of doped silicon dioxide. A contact hole 26 has been formed in layer 24 down to substrate 12. Prior to filling contact hole 26, a clean step is required to remove unwanted native oxide and any other oxide contamination from a contact area 28 to insure formation of a reliable, low resistance contact. This clean step is typically a dilute HF dip. The dilute HF dip, in addition to removing contamination from contact area 28, removes a portion of layer 24, resulting in a decrease in a distance C from the edge of contact hole 26 to the edge of one of container capacitors 22. If distance C becomes sufficiently small, the conductive material subsequently used to fill contact hole 26 will short to a nearby one of container capacitors 22, resulting in circuit failure.

The present invention avoids this problem by employing a clean step in which the rate of removal of native oxide and other oxide contamination at contact area 28 is much increased relative to the rate of removal of layer 24, when compared with the typical dilute HF. This results in a maximization of distance C, such that shorts between a contact subsequently formed in contact hole 26 and container capacitors 22 are less likely to occur.

In accordance with the present invention, the clean step used in the methods described above with respect to FIGS. 1–3 is a dip in a cleaning solution which etches thermal oxide at least one-third the rate of a doped silicon dioxide such as BPSG, and preferably at least one-half that rate. Typical dilute HF etches thermal oxide at only one-ninth or less the rate of doped silicon dioxide such as BPSG. The increased etch rates of thermal oxide relative to doped silicon dioxide such as BPSG of the cleaning solutions utilized in the present invention result in both increased removal of thermal oxide and native oxide and other oxide contaminants and decreased removal of the doped silicon dioxide such as BPSG.

One preferred cleaning solution for use with the above methods is a solution comprising in the range of about 45 to 48 parts ammonium fluoride, about 7 to 9 parts hydrogen fluoride, and about 9 to 11 parts ammonium hydroxide by weight in water. The water content is preferably about 95 to 105 parts water by weight. The currently most preferred ratios are about 46 parts ammonium fluoride and about 8 parts hydrogen fluoride and about 10 parts ammonium hydroxide to about 100 parts water by weight. A solution of approximately these proportions may be prepared by mixing, for example, 7:1 buffered oxide etchant (BOE) in a volumetric ratio of 3.8:1 with 29% ammonium hydroxide. This solution has been found to etch BPSG (6% phosphorous and 3% boron) at a rate of about 60 Angstroms/minute, and thermal oxide at a rate of about 30 Angstroms/minute at 75° C. This is a considerable improvement over standard dilute (100:1) HF, which exhibits about the same rate for thermal oxide but etches BPSG (6% phosphorous and 3% boron) at a rate of about 300 Angstroms/minute or more. This cleaning solution thus provides nearly a five-fold decrease in the ratio of BPSG etch rate to thermal oxide etch rate, as compared with 100:1 HF. This cleaning solution is also useful to remove post etch/post ash residues, which can be removed in as little as 20 seconds.

A second preferred cleaning solution for use with the above methods is a solution comprising in the range of about 650 to 700 parts ammonium fluoride and about 2 to 4 parts hydrogen fluoride by weight in water. The water component is preferably in the range of about 950 to 1,050 parts water by weight. The currently most preferred ratios are about 670 parts ammonium fluoride and about 3 parts hydrogen fluoride in about 1000 parts water by weight. A solution of approximately these ratios may be prepared, for example, by mixing in volumetric ratio, 267 parts of 40% ammonium fluoride solution and 1 part of 49% hydrofluoric acid. This solution has been shown to etch thermal oxide at a rate of about 20 to 30 Angstroms/minute BPSG (6% phosphorous and 3% boron) at a rate of about 45–50 Angstroms/minute at 75° C. This similarly represents nearly a five-fold decrease in the ratio of BPSG etch rate to thermal oxide etch rate, as compared with 100:1 HF. The decrease is even more dramatic with rich BPSG (9% phosphorous, 6% boron). Dilute HF (100:1) etches rich BPSG at a rate of 630 Angstroms/minute or more, while this second preferred cleaning solution etches rich BPSG at a rate of about 65 Angstroms/minute.

This second preferred cleaning solution is also useful in cleaning a surface that includes a refractory metal silicide, such as titanium silicide. While the ratios disclosed above for the second preferred cleaning solution may be used, the most preferred ratios are slightly different. Most preferred for this method of using the second preferred cleaning solution are the ratios of about 670 parts ammonium fluoride and about 1.6 parts hydrogen fluoride in about 1000 parts water by weight. A solution of approximately these ratios may be prepared, for example, by mixing, in volumetric ratio, 500 parts of 40% ammonium fluoride solution and 1 part of 49% hydrofluoric acid. This solution etches thermal oxide at about 21 Angstroms/minute and titanium silicide at about 40 Angstroms/minute, compared to titanium silicide etch rates as high as 1000 Angstroms/minute or more in 100:1 HF.

Figure 4:
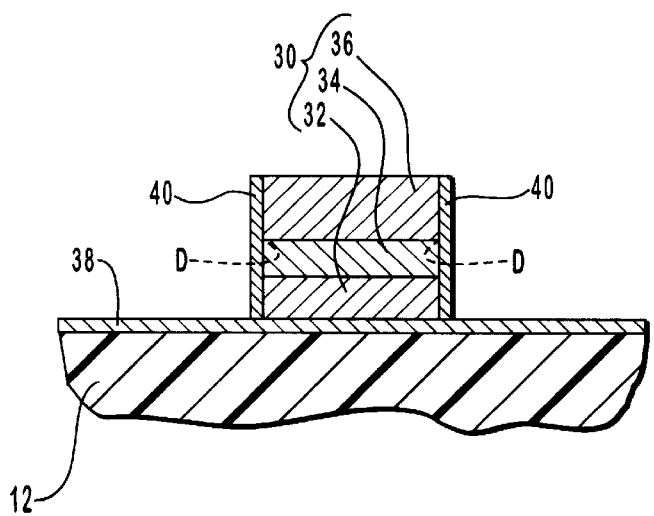
FIG. 4 is a partial cross section of a partially completed semiconductor device including a gate stack around which spacers are to be formed.
Figure 5:
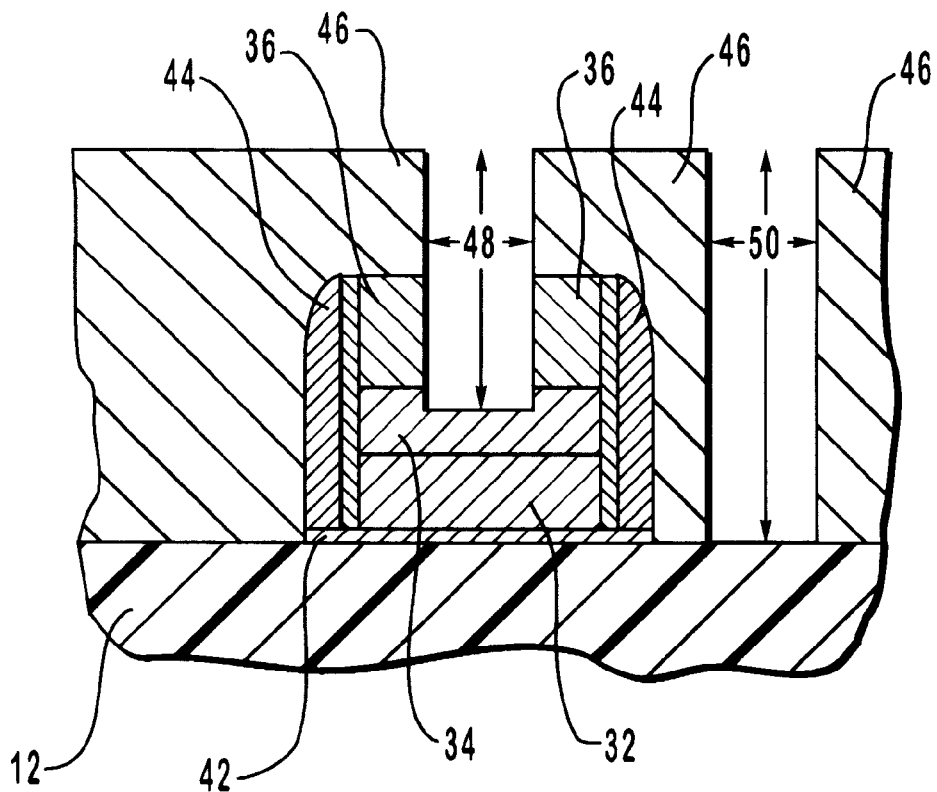
FIG. 5 is a partial cross section of a partially completed semiconductor device including a gate stack to which a contact is to be formed.

Useful methods for applying the second preferred cleaning solution in cleaning a surface, including an exposed refractory metal silicide, are illustrated in FIGS. 4 and 5.

FIG. 4 shows a substrate 12 upon which a gate stack 30 has been formed including a polysilicon gate 32, a refractory metal silicide layer such as a titanium silicide layer 34, and a dielectric layer 36. Thermal oxide layer 38 overlies substrate 12. A thin oxide layer 40 encloses gate stack 30. Thin oxide layer 40 is produced during a plasma etch step previously used to define gate stack 30. Thin oxide layer 40 must be removed before deposition of a layer of spacer material to form spacers enclosing gate stack 30 in order that uniform, high quality spacers can be reliably formed. Removal of thin oxide layer 40 is typically accomplished with a 100:1 HF dip, creating a problem with deterioration of titanium silicide layer 34 as thin oxide layer 40 is removed, exposing the laterally facing surfaces of titanium, silicide layer 34 to the HF dip solution. Titanium silicide layer 34 is then removed at the edges thereof such as at the areas shown for example by dotted lines D, resulting in increased resistance of the structure and in malformed spacers surrounding gate stack 30. Use of the second preferred etchant above greatly reduces such deterioration during removal of thin oxide layer 40.

FIG. 5 shows a substrate 12 upon which a gate stack has been formed including a gate oxide 42, a polysilicon gate 32, a titanium silicide layer 34, and a dielectric layer 36. The gate stack is enclosed by spacers 44. A layer of doped silicon dioxide 46, such as BPSG, has been deposited over substrate 12 and the gate stack thereon, and contact holes 48, 50, have been formed therein downward to titanium silicide layer 34 and substrate 12, respectively. A clean step is then required before filling contact holes 48, 50 to form contacts to titanium silicide layer 34 and substrate 12. If the typical 100:1 HF is used, severe erosion and even complete etchthrough of titanium silicide layer 34 can result, which cause an increase in contact resistance. Use of the second preferred etchant above allows a thorough clean of the portion of substrate 12 at the bottom of contact hole 50 without significantly eroding titanium silicide layer 34.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for providing a contact to a semiconductor substrate, said method comprising:

providing a semiconductor substrate, said semiconductor substrate having a layer of doped silicon dioxide formed thereover, said layer of doped silicon dioxide having a topmost surface, said semiconductor substrate having a source/drain region defined therein;

forming in said layer of doped silicon dioxide a space extending down through said layer of doped silicon dioxide to said source/drain region;

exposing said source/drain region to a solution having an etch rate for thermal oxide of at least one-half of the etch rate of said solution for said layer of doped silicon dioxide;

forming a layer of polysilicon over said semiconductor substrate and said layer of doped silicon dioxide to contact said source/drain region, said layer of polysilicon having a top; and removing said layer of polysilicon from the top thereof downward to at least the topmost surface of said layer of doped silicon dioxide.

2. The method as defined in claim 1, wherein the solution includes a liquid solvent and a plurality of solutes including ammonium fluoride, hydrogen fluoride, and ammonium hydroxide.

3. The method as defined in claim 2, wherein the solvent is water and the solution comprises in the range, by weight, of about:

45 to 48 parts ammonium fluoride;

7 to 9 parts hydrogen fluoride;

9 to 11 parts ammonium hydroxide; and 95 to 105 parts water.

4. The method as defined in claim 1, wherein the solution includes a liquid solvent and a plurality of solutes including ammonium fluoride and hydrogen fluoride.

5. The method as defined in claim 4, wherein the solvent is water and the solution comprises in the range, by weight, of about:

650 to 700 parts ammonium fluoride;

2 to 4 parts hydrogen fluoride; and 950 to 1,050 parts water.

6. The method as defined in claim 1, wherein said solution has an etch rate for thermal oxide of at least one-third of the etch rate of said solution for said layer of doped silicon dioxide.

7. The method as defined in claim 1, wherein said the doped silicon dioxide is BPSG.

8. The method as defined in claim 1, wherein the semiconductor substrate is composed of silicon.

9. A method for providing a contact to a semiconductor substrate, said method comprising:

providing a semiconductor substrate, said semiconductor substrate having a layer of doped silicon dioxide formed thereover, said layer of doped silicon dioxide having a topmost surface, said semiconductor substrate having a source/drain region defined therein;

forming in said layer of doped silicon dioxide a space extending down through said layer of doped silicon dioxide to said source/drain region;

exposing said source/drain region to a solution having an etch rate for thermal oxide of at least one-half of the etch rate of said solution for said layer of doped silicon dioxide;

forming a layer of conductive material over said semiconductor substrate and said layer of doped silicon dioxide to contact said source/drain region, said layer of conductive material having a top; and removing said layer of conductive material from the top thereof downward to at least the topmost surface of said layer of doped silicon dioxide.

10. The method as defined in claim 9, wherein the solution includes a liquid solvent and a plurality of solutes including ammonium fluoride, hydrogen fluoride, and ammonium hydroxide.

11. The method as defined in claim 10, wherein the solvent is water and the solution comprises in the range, by weight, of about:

45 to 48 parts ammonium fluoride;

7 to 9 parts hydrogen fluoride;

9 to 11 parts ammonium hydroxide; and 95 to 105 parts water.

12. The method as defined in claim 9, wherein:

the conductive material comprises polysilicon;

the doped silicon dioxide material comprised BPSG; and the solution includes a liquid solvent and a plurality of solutes including ammonium fluoride and hydrogen fluoride.

13. The method as defined in claim 12, wherein the solvent is water and the solution comprises in the range, by weight, of about:

650 to 700 parts ammonium fluoride;

2 to 4 parts hydrogen fluoride; and 950 to 1,050 parts water.

14. The method as defined in claim 9, wherein said solution has an etch rate for thermal oxide of at least one-third of the etch rate of said solution for said layer of doped silicon dioxide.

15. The method as defined in claim 10, wherein the conductive material comprises a refractory metal silicide.

16. A method for providing a contact to a silicon substrate, said method comprising:

providing a silicon substrate, said silicon substrate having a layer of BPSG formed thereover, said layer of BPSG having a topmost surface, said silicon substrate having a source/drain region defined therein;

forming in said layer of BPSG a space extending down through said layer of BPSG to said source/drain region;

exposing said source/drain region to a solution having an etch rate for thermal oxide of at least one-half of the etch rate of said solution for said layer of BPSG;

forming a layer of polysilicon over said silicon substrate and said layer of BPSG to contact said source/drain region, said layer of polysilicon having a top; and removing said layer of polysilicon from the top thereof downward to at least the topmost surface of said layer of BPSG.

17. The method as defined in claim 16, wherein the solution includes a liquid solvent and a plurality of solutes including ammonium fluoride, hydrogen fluoride, and ammonium hydroxide.

18. The method as defined in claim 17, wherein the solvent is water and the solution comprises in the range, by weight, of about:

45 to 48 parts ammonium fluoride;

7 to 9 parts hydrogen fluoride;

9 to 11 parts ammonium hydroxide; and 95 to 105 parts water.

19. The method as defined in claim 16, wherein the solution includes a liquid solvent and a plurality of solutes including ammonium fluoride and hydrogen fluoride.

20. The method as defined in claim 19, wherein the solvent is water and the solution comprises in the range, by weight, of about:

650 to 700 parts ammonium fluoride;

2 to 4 parts hydrogen fluoride; and 950 to 1,050 parts water.

21. The method as defined in claim 16, wherein said solution has an etch rate for thermal oxide of at least one-third of the etch rate of said solution for said layer of BPSG.

* * * * *

UNITED STATES PATENT AND TRADEMARK OFFICE
CERTIFICATE OF CORRECTION

PATENT NO. : 6,210,489 B1      Page 1 of 1
DATED : April 3, 2001
INVENTOR(S) : Whonchee Lee; Richard C. Hawthorne; Li Li; Pai Hung Pan It is certified that error appears in the above-identified patent and that said Letters Patent is hereby corrected as shown below:

<u>Column 4,</u>
Line 2, change "FIG. I" to -- FIG. 1 --

<u>Column 7,</u>
Line 23, after "said" delete [the]

Signed and Sealed this

Fifth Day of March, 2002

*Attest:*

JAMES E. ROGAN
*Attesting Officer*     *Director of the United States Patent and Trademark Office*